US010466501B2

(12) United States Patent
Bakin et al.

(10) Patent No.: US 10,466,501 B2
(45) Date of Patent: Nov. 5, 2019

(54) OPTOELECTRONIC MODULES INCLUDING AN OPTICAL SYSTEM TILTED WITH RESPECT TO A FOCAL PLANE

(71) Applicant: ams Sensors Singapore Pte. Ltd., Singapore (SG)

(72) Inventors: Dmitry Bakin, San Jose, CA (US); Matthias Gloor, Boswil (CH)

(73) Assignee: AMS SENSORS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/604,794

(22) Filed: May 25, 2017

(65) Prior Publication Data

US 2017/0343831 A1 Nov. 30, 2017

Related U.S. Application Data

(60) Provisional application No. 62/341,751, filed on May 26, 2016.

(51) Int. Cl.
| | |
|---|---|
| *G02B 27/62* | (2006.01) |
| *G02B 27/00* | (2006.01) |
| *G02B 27/09* | (2006.01) |
| *H04N 5/225* | (2006.01) |
| *H01S 5/022* | (2006.01) |
| *H01S 5/183* | (2006.01) |

(52) U.S. Cl.
CPC ......... *G02B 27/62* (2013.01); *G02B 27/0012* (2013.01); *G02B 27/0025* (2013.01); *G02B 27/0988* (2013.01); *H04N 5/2254* (2013.01); *H01S 5/02268* (2013.01); *H01S 5/02296* (2013.01); *H01S 5/18386* (2013.01)

(58) Field of Classification Search
CPC ................ G02B 27/62; G02B 27/0025; G02B 27/0012; G02B 27/0988; H04N 5/2254; H01S 5/18386; H01S 5/02296; H01S 5/02268
See application file for complete search history.

(56) References Cited

U.S. PATENT DOCUMENTS

| | | | | | |
|---|---|---|---|---|---|
| RE34,489 | E | * | 12/1993 | Hansma ................ | B82Y 35/00 250/306 |
| 5,731,914 | A | * | 3/1998 | Meyers ................. | G02B 15/17 359/683 |
| 5,998,801 | A | * | 12/1999 | Imai ...................... | B23K 20/02 250/548 |
| 6,343,974 | B1 | * | 2/2002 | Francedillaa .......... | B24B 49/10 451/10 |
| 6,541,284 | B2 | * | 4/2003 | Lam .................. | H01L 27/14618 257/E31.118 |

(Continued)

*Primary Examiner* — Mohamed K Amara
(74) *Attorney, Agent, or Firm* — Michael Best & Friedrich LLP

(57) ABSTRACT

The present disclosure describes optoelectronic modules that include an optical system tilted with respect to a focal plane. For example, an optoelectronic module can includes an optical system including a vertical alignment feature. An optoelectronic sub-assembly includes an active optoelectronic device, wherein the vertical alignment rests on a surface of the optoelectronic sub-assembly and wherein an optical axis of the optical system is tilted with respect to a focal plane in the sub-assembly.

8 Claims, 6 Drawing Sheets

(56) References Cited

U.S. PATENT DOCUMENTS

| | | | | |
|---|---|---|---|---|
| 7,759,751 B2* | 7/2010 | Ono | H01L 27/14618 | 257/432 |
| 8,199,250 B2* | 6/2012 | Kim | G03B 3/00 | 250/208.1 |
| 8,228,426 B2* | 7/2012 | Matsuo | H01L 23/481 | 257/294 |
| 8,519,457 B2* | 8/2013 | Sekine | H04N 5/2253 | 257/292 |
| 8,714,843 B2* | 5/2014 | Woo | G03B 17/00 | 396/529 |
| 9,182,602 B2* | 11/2015 | Imamura | G02B 27/10 | |
| 9,838,601 B2* | 12/2017 | Georgiev | G06T 3/4038 | |
| 9,887,221 B2* | 2/2018 | Rudmann | H01L 27/14618 | |
| 9,977,223 B2* | 5/2018 | Lai | G02B 13/04 | |
| 10,007,085 B2* | 6/2018 | Tang | G02B 13/0045 | |
| 10,038,021 B2* | 7/2018 | Yamamoto | H01L 27/14618 | |
| 10,156,688 B1* | 12/2018 | Wang | G02B 6/4236 | |
| 10,204,945 B2* | 2/2019 | Rudmann | H01L 27/14618 | |
| 2004/0056971 A1* | 3/2004 | Yang | H04N 5/2253 | 348/294 |
| 2004/0212719 A1* | 10/2004 | Ikeda | H04N 5/2254 | 348/340 |
| 2004/0239785 A1* | 12/2004 | Nanjo | G02B 7/102 | 348/294 |
| 2005/0163016 A1* | 7/2005 | Kimura | G02B 13/001 | 369/112.01 |
| 2005/0275746 A1* | 12/2005 | Nishida | G02B 7/02 | 348/360 |
| 2006/0001733 A1* | 1/2006 | Yamamura | B41J 2/451 | 347/241 |
| 2006/0045410 A1* | 3/2006 | Trott | G02B 6/4214 | 385/14 |
| 2006/0171701 A1* | 8/2006 | Kim | G03B 7/099 | 396/275 |
| 2007/0241273 A1* | 10/2007 | Kim | H01L 27/14625 | 250/239 |
| 2009/0002853 A1* | 1/2009 | Yuan | G02B 7/021 | 359/819 |
| 2009/0033789 A1* | 2/2009 | Lin | G02B 7/02 | 348/374 |
| 2010/0091283 A1* | 4/2010 | Marioni | G02B 7/003 | 356/400 |
| 2010/0328517 A1* | 12/2010 | Mathieu | G02B 27/0037 | 348/340 |
| 2011/0098991 A1* | 4/2011 | Cahall | G01M 11/0221 | 703/2 |
| 2012/0113318 A1* | 5/2012 | Galstian | B29D 11/00298 | 348/374 |
| 2014/0063323 A1* | 3/2014 | Yamazaki | G02B 13/18 | 348/335 |
| 2014/0120805 A1* | 5/2014 | Duescher | B24B 37/32 | 451/41 |
| 2014/0125849 A1 | 5/2014 | Heimgartner et al. | | |
| 2015/0077571 A1* | 3/2015 | Fantone | H04N 17/002 | 348/181 |
| 2015/0247987 A1* | 9/2015 | Shigemitsu | G02B 7/023 | 348/360 |
| 2015/0256726 A1* | 9/2015 | Kaioka | G01B 11/26 | 348/360 |
| 2015/0293330 A1* | 10/2015 | Gutierrez | G02B 13/0015 | 359/811 |
| 2016/0356978 A1* | 12/2016 | Osborne | G02B 7/004 | |
| 2017/0038502 A1* | 2/2017 | Georgiev | G02B 3/0056 | |
| 2017/0104903 A1* | 4/2017 | Warashina | G02B 7/04 | |
| 2017/0348814 A1* | 12/2017 | Wiegmann | G01B 5/004 | |
| 2018/0059354 A1* | 3/2018 | Gutierrez | G02B 7/003 | |

* cited by examiner

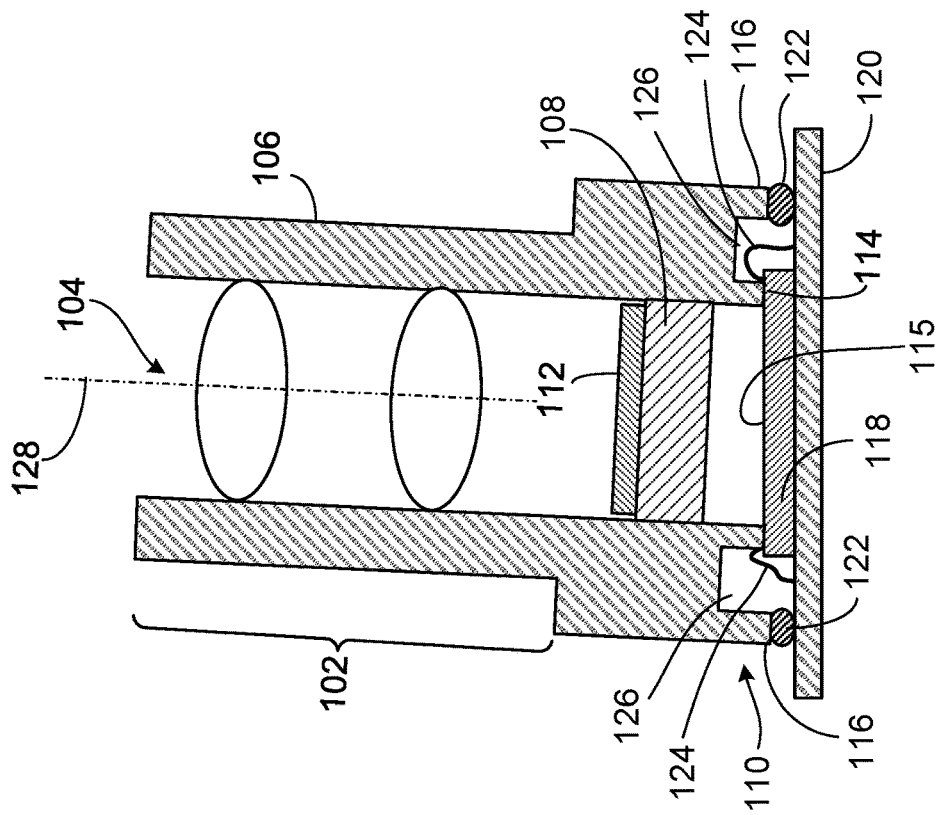
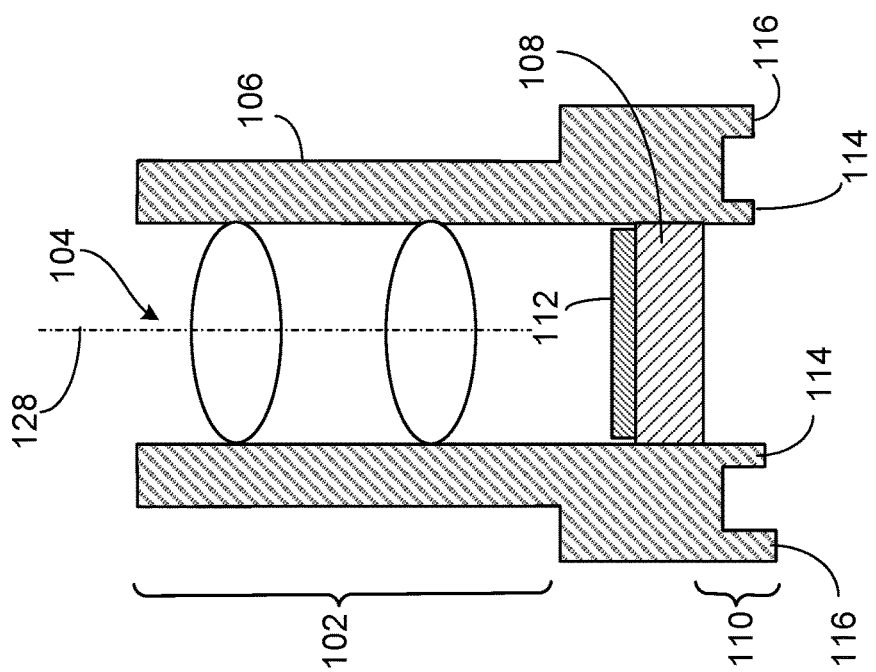
FIG. 2B
FIG. 2A

OPTOELECTRONIC MODULES INCLUDING AN OPTICAL SYSTEM TILTED WITH RESPECT TO A FOCAL PLANE

FIELD OF THE DISCLOSURE

The present disclosure relates to optoelectronic modules that include an optical system tilted with respect to a focal plane.

BACKGROUND

Applications employing optical systems integrated into optoelectronic modules can be highly sensitive to tolerances in the optical systems. Such tolerances include optical element sub-assembly tolerances (e.g., off-center, tilted, decentered optical elements (i.e., centration error with respect to two or more optical elements)), tolerances in optical element surface profiles (e.g., decentered surfaces within a single optical element (prevalent in lower quality (e.g., injection molded) optical elements)), optical system to image sensor sub-assembly tolerances, and/or optical system to light-source sub-assembly tolerances. These tolerances can result in distortion asymmetry, for example.

In some instances when optical systems are employed to focus an image onto an image plane (coincident with an image sensor), the image collected by the image sensor can exhibit significant distortion asymmetry. Accordingly, the image quality of the collected image can be rather poor. In other instances, for example, when optical systems are employed to project or cast a pattern or image onto a plane in the far field, the image or pattern can exhibit significant distortion asymmetry. In such instances, the projected or cast pattern or image may be used for structured light applications (i.e., to collect three-dimensional data), but the distortion asymmetry can be highly problematic (e.g., precision and/or accuracy of the three-dimensional data may be dramatically compromised).

Active alignment can be used to correct for the aforementioned tolerances. Active alignment, however, can be time-consuming and thus not conducive to large-scale production of optical systems/optoelectronic modules. For example, active alignment of an optical system relative to an image sensor might involve recording data (e.g., images) via the image sensor and actively tilting the optical system with respect to the image sensor until substantially distortion-free data (e.g., an image) is obtained. Uncured epoxy interposed between the optical system and the image sensor would then be cured to fix the optical system in place.

SUMMARY

The present disclosure describes optoelectronic modules that include an optical system tilted with respect to a focal plane.

For example, in one aspect, a method includes acquiring optical data for an optical system that includes a vertical alignment feature. A height of the vertical alignment feature is adjusted based, at least in part, on the acquired optical data. The method includes placing the optical system over an optoelectronic sub-assembly such that the vertical alignment rests on a surface of the optoelectronic sub-assembly and such that an optical axis of the optical system is tilted with respect to a focal plane in the sub-assembly.

Some implementations include one or more of the following features. For example, adjusting the height can include machining the vertical alignment feature. In some cases, the acquired optical data can includes modulation transfer function versus z data of an on-axis field parameter and a plurality of off-axis field parameters, wherein the z data represents a distance from the optical system.

Placing the optical system over the optoelectronic sub-assembly can include, for example, placing the optical system such that the vertical alignment feature rests directly in contact with a surface of an image sensor. In some instances, placing the optical system over the optoelectronic sub-assembly includes placing the optical system such that the vertical alignment feature rests directly in contact with a surface of an illumination projector sub-assembly. The illumination projector sub-assembly may include a mask, wherein placing the optical system over the optoelectronic sub-assembly includes placing the optical system such that the vertical alignment feature rests directly in contact with a surface of the mask.

In accordance with another aspect, an optoelectronic module includes an optical system including a vertical alignment feature. An optoelectronic sub-assembly includes an active optoelectronic device, wherein the vertical alignment rests on a surface of the optoelectronic sub-assembly and wherein an optical axis of the optical system is tilted with respect to a focal plane in the sub-assembly.

In some implementations, the vertical alignment feature includes an annular or semi-annular protrusion. Different parts of the protrusion can have heights that differ from one another. In some instances, the vertical alignment feature includes a multitude of protrusions whose respective heights differ from one another.

In some instances, introducing the tilt can alleviate or correct for distortion asymmetry and/or other undesirable effects resulting from tolerances in the optical system.

Other aspects, features and advantages will be readily apparent from the following detailed description, the accompanying drawings and the claims.

BRIEF DESCRIPTION OF THE DRAWINGS

FIG. 2A is an example of an optical system.

FIG. 2B is an example of an optoelectronic module that includes the optical system of FIG. 2A.

DETAILED DESCRIPTION

Figure 1:
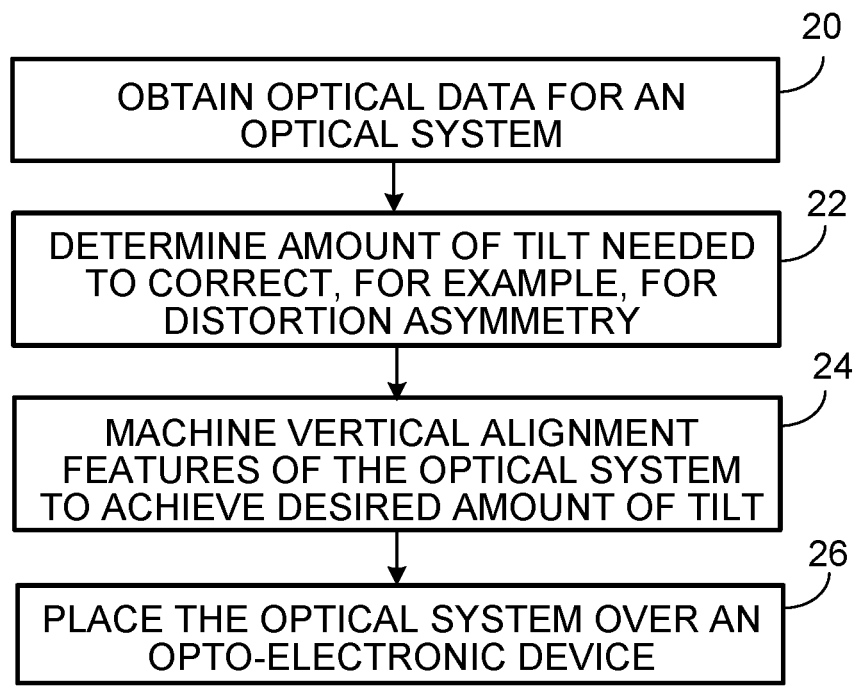
FIG. 1 is a flow chart of a method according to the invention.

In general terms, as illustrated by FIG. 1, optical data is obtained for an optical system (20), and the amount of tilt needed to correct for a distortion (e.g., distortion asymmetry) is determined (22). For example, modulation transfer function ("MTF") vs. z data of an on-axis field parameter and two or more off-axis field parameters (e.g., extreme-field parameters) can be measured and collected, where the z data represents the distance between the optical system and image sensor/light source. The distance between MTF vs. z on-axis curve peak and MTF vs. z off-axis curve peaks can be used to determine the amount of tilt needed to correct for the distortion(s.) One or more vertical alignment features of the optical system can be machined (e.g., via micromachining) to achieve the desired amount of tilt (24) with respect to the focal plane when the optical system is placed over a optoelectronic sub-assembly as part of an illumination projection module or image sensor module. The optical system then can be placed over and attached to the optoelectronic sub-assembly (26). In this manner the distortion asymmetry, or other undesirable effects resulting from tolerances in the optical system, can be corrected quickly and efficiently. In some implementations, the techniques described here can obviate the need to collect data for the optical system while actively tilting the optical system.

The vertical alignment feature may be implemented, for example, as a single continuous annular or semi-annular protrusion, or as one or more protrusions (e.g., pillars, such as columns or studs). In some instances, different parts of a single continuous annular or semi-annular protrusion can have different heights so as to provide the desired amount of tilt of the optical system with respect to the focal plane. Where the vertical alignment feature is implemented as multiple protrusions, the protrusions can have heights that differ from one another so as to provide the desired amount of tilt with respect to the focal plane.

Specific examples are described below. The techniques described here, however, are not limited to these examples and can be used to introduce tilt of an optical system in other light projecting or light sensing modules as well.

As shown in FIG. 2A, an optical system includes a beam shaping system 102 (e.g., optical sub-assembly 104 and lens barrel 106) at one side (i.e., the object-side) of a transparent plate 108, and a spacer 110 at the second side (i.e., the sensor-side) of the transparent plate 108. The lens barrel 106 can be attached to the spacer 110, for example, by adhesive or may be formed as a unitary piece with the spacer 402. In some instances, an optical element such as an optical filter 112 may be present on the transparent plate 108. As illustrated in FIG. 2A, the spacer 110 has a through-hole substantially aligned with the beam shaping system 102 and corresponds to an optical channel. The spacer 110 includes a first extension 114 that provides a vertical alignment edge for contacting the surface of an image sensor, and a second extension 116 that provides a printed circuit board (PCB) adhesion edge. The sensor alignment edge 114 defines the distance from the upper surface of the image sensor 118 to the optical sub-assembly 104 (see FIG. 2B). The PCB adhesion edge 116 provides the bond line (i.e., the location where adhesive is placed for attachment to the PCB 120).

The sensor alignment edge 114 can be customized (e.g., machined such as by cutting, dicing or grinding) so as to introduce tilt with respect to the focal plane and, thereby correct, for example, for distortion asymmetry. As shown in FIG. 2B, the alignment edge 114 is placed in direct contact with an inactive portion of the image sensor 118 (e.g., near the periphery of the sensor 118). Preferably, no adhesive is used between the alignment edge 114 and the surface of the sensor 118. The PCB adhesion edge 116 also can be customized (e.g., machined) such that it is allows the alignment edge 114 to make contact with the upper surface of the image sensor 118, and also allows for adhesive (e.g., at a thickness of approximately 20 μm±5 to 10 μm) to be present between the adhesion edge 116 and the upper surface of the PCB 120 (see FIG. 2B).

The customized spacer 110 can provide various advantages in some implementations. For example, the adhesive 122 can be kept away more easily from the image sensor 118. Further, the wires 124 connecting the sensor 118 to the PCB 120 can be better protected because they are disposed within a cavity 126 between the alignment and adhesion edges 114, 116. Also, better control of the amount of tilt introduced between a central axis 128 of the optical sub-assembly 104 and the focal plane (i.e., the plane of the image sensor 118) can be achieved in some cases because the adhesive is on the PCB adhesion edge 116, not the sensor alignment edge 114.

The vertical alignment edge 114 can take any one of various forms. For example, in some instances, the alignment edge 114 is a single continuous annular or semi-annular protrusion that laterally surrounds the periphery of the active (i.e., photosensitive) portion 115 of the image sensor 118. Different parts of the alignment edge can have different heights so as to provide the desired amount of tilt. In other implementations, the sensor alignment edge 114 can be implemented as a multitude of individual pillars. Preferably, there are at least three such pillars to provide mechanical stability. Different one of the pillars can have different heights so as to provide the desired amount of tilt.

Figure 3A:
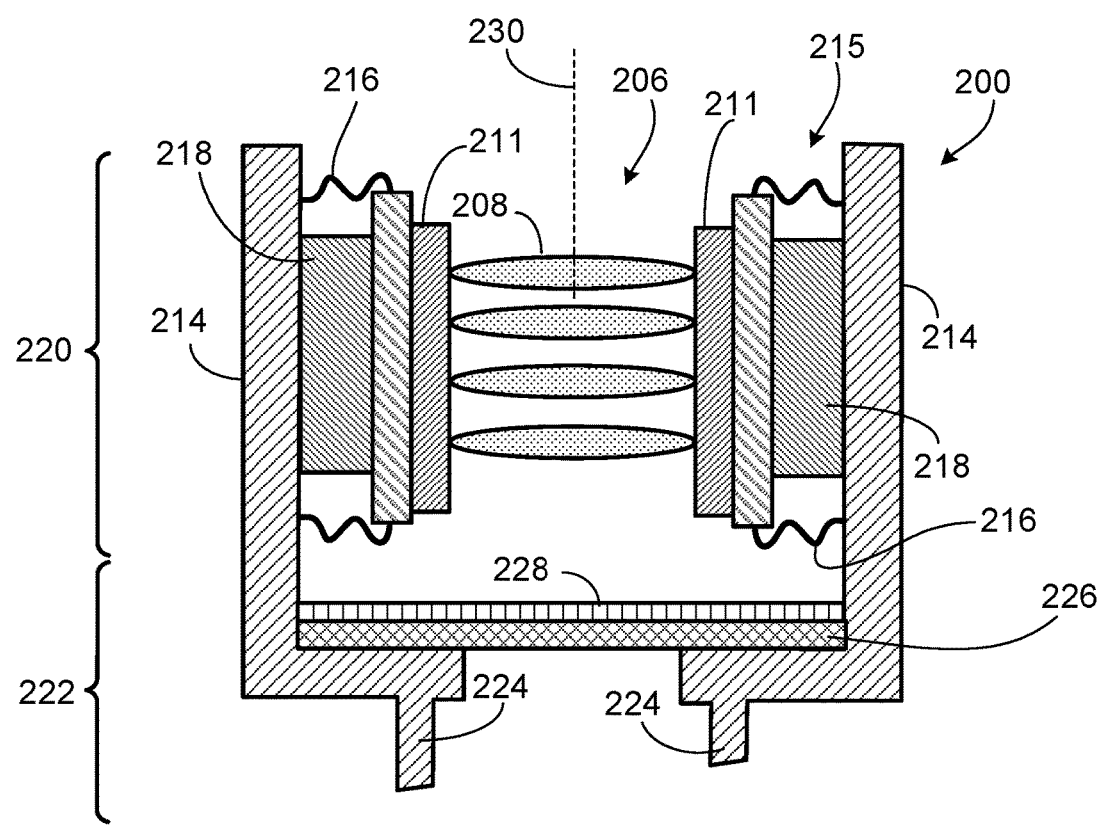
FIG. 3A is another example of an optical system.

Similar techniques can be used to introduce tilt into other types of image sensing modules, such as small footprint camera modules with auto focus control that can help achieve focusing, zooming and/or image stabilization. For example, as shown in FIG. 3A, an optical sub-assembly 206 includes a stack of one or more optical beam shaping elements such as lenses 208. The lenses 208 can be disposed, for example, within a lens barrel 211 in a lens barrel housing 214. The lens barrel housing 214 can be, for example, an elongated tubular structure within which the optical sub-assembly 206 is mounted. Together, the lens barrel housing 214 and optical sub-assembly 206 form a first sub-assembly 220, which can be referred to as a lens barrel sub-assembly.

Movement of the optical sub-assembly 206 (e.g., for auto-focus control) can be accomplished, for example, by using an electromagnetic actuator 215 such as a VCM integrated into the lens barrel housing 214. In some cases, the actuator 215 includes springs 216 and a magnet 218. In some instances, the actuator 215 can include one or more electrically conductive pins, voice coils, piezoelectric components, and/or electromagnetic components. In some instances, movement of the optical sub-assembly 206 can be accomplished using a MEMS device (e.g., a MEMS electrostatic actuator). Movement of the actuator can allow the distance between the lenses 208 in the optical sub-assembly 206 and an image sensor 202 (see FIG. 3B) to be adjusted, for example, by as much as several tens of microns (e.g., +20 μm).

The lens barrel sub-assembly 220 is attached (e.g., by adhesive) to a second sub-assembly 222 that includes one or more spacers 224 that serve as vertical alignment features. The second sub-assembly 222, which can be referred to as a spacer sub-assembly, can further include a transparent cover 226 and an optical filter 228 that selectively allows radiation of particular wavelength or range of wavelengths (visible or IR) to pass from the optical sub-assembly 206 to active regions (e.g., pixels 203) of the image sensor 202. The transparent cover 226 can be composed, for example, of glass or another inorganic material such as sapphire that is transparent to wavelengths detectable by the image sensor 202. The vertical spacers 224, which can be composed, for example, of a material that is substantially opaque for the wavelength(s) of light detectable by the image sensor 202, are in direct contact with inactive regions of the image sensor 202. The spacer(s) 224 can be formed, for example, as a single continuous annular or semi-annular protrusion, or as one or more protrusions (e.g., pillars, such as columns or studs).

During fabrication of the module 200, the height of the vertical alignment spacer(s) 224 can be adjusted, as needed, to introduce a desired amount of tilt between the optical axis 230 of the optical sub-assembly 206 and the plane of the image sensor 202. Such adjustment can be performed, for example, by micromachining (e.g., cutting, dicing or grinding) the free end(s) of the spacers 224. The tilt can help correct for distortion asymmetry. If the spacer 224 is formed as a single continuous annular or semi-annular protrusion, different parts of the spacer can have different heights so as to provide the desired amount of tilt. If the spacers 224 are formed as multiple protrusions (e.g., pillars, such as columns or studs), the heights of the protrusions can differ from one another so as to provide the desired amount of tilt.

Figure 3B:
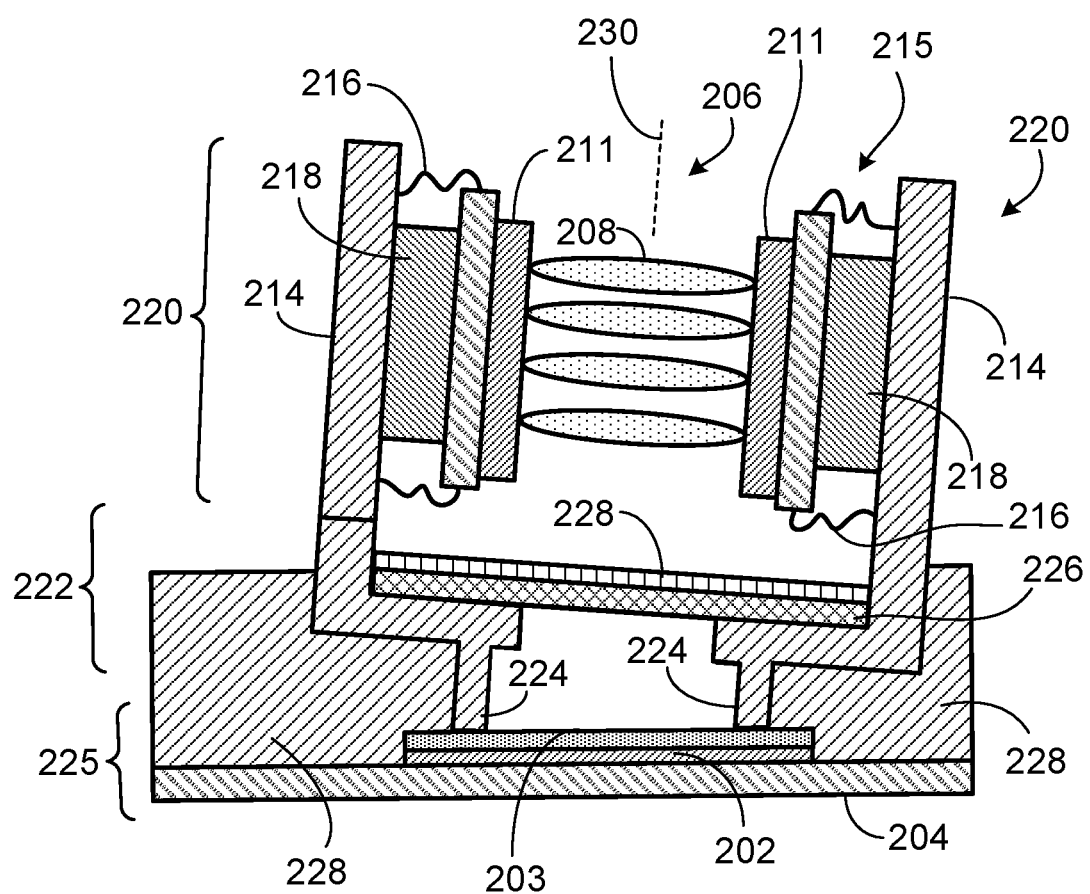
FIG. 3B is an example of an optoelectronic module that includes the optical system of FIG. 3A.

The combined sub-assembly 220, 222 can be mounted on the PCB/image sensor sub-assembly 225 (see FIG. 3B). The spacer(s) 224 can be in direct contact (i.e., without adhesive) with inactive areas of the image sensor 122. Supporting the spacer(s) 224 directly on the image sensor 202 without adhesive can help ensure that the desired amount of tilt is provided between the optical sub-assembly 206 and the plane of the image sensor. The actuator 215 then can be used to adjust the position of the optical sub-assembly 206 within the lens barrel housing 214 so that the focal-length of the lenses 208 is properly focused on the surface of the image sensor 202.

In some implementations, the module 200 includes outer walls 228 that laterally surround the spacer(s) 124 and are attached (e.g., by adhesive) to the sensor-side of the printed circuit board (PCB) 204. In some cases, the outer walls 228 are formed by a dam and fill process after the combined sub-assembly 120, 122 is attached to the PCB/image sensor sub-assembly 125. In other instances, the outer walls 228 can be formed integrally as part of the spacer(s) 124 (e.g., by vacuum injection or injection molding). The image sensor module 200 can provide ultra-precise and stable packaging for the image sensor 202 mounted on the PCB 204.

In the foregoing embodiments of FIGS. 2B and 3B, each of the image sensors 118, 228, which are examples of active optoelectronic devices, can include an array of active elements (i.e., pixels) each of which is sensitive to electromagnetic radiation. The image sensors can be implemented, for example, as a CCD or CMOS pixel array operable to sense electromagnetic radiation (e.g., infra-red (IR), visible, or UV) of a particular wavelength or range of wavelengths. Further, each image sensor 118, 128 can be implemented as part of an integrated circuit (IC) formed, for example, as a semiconductor chip device that includes circuitry to perform processing (e.g., analog-to-digital processing) of signals produced by the light sensing elements. In some implementations, each of the sensors is operable to sense light of the same wavelength or range of wavelengths, whereas in other implementations, the sensors are operable to sense light at different wavelengths or ranges of wavelengths from one another. In some implementations, flip chip technology can be used to provide the electrical connections between the image sensors and the PCBs.

Figure 4A:
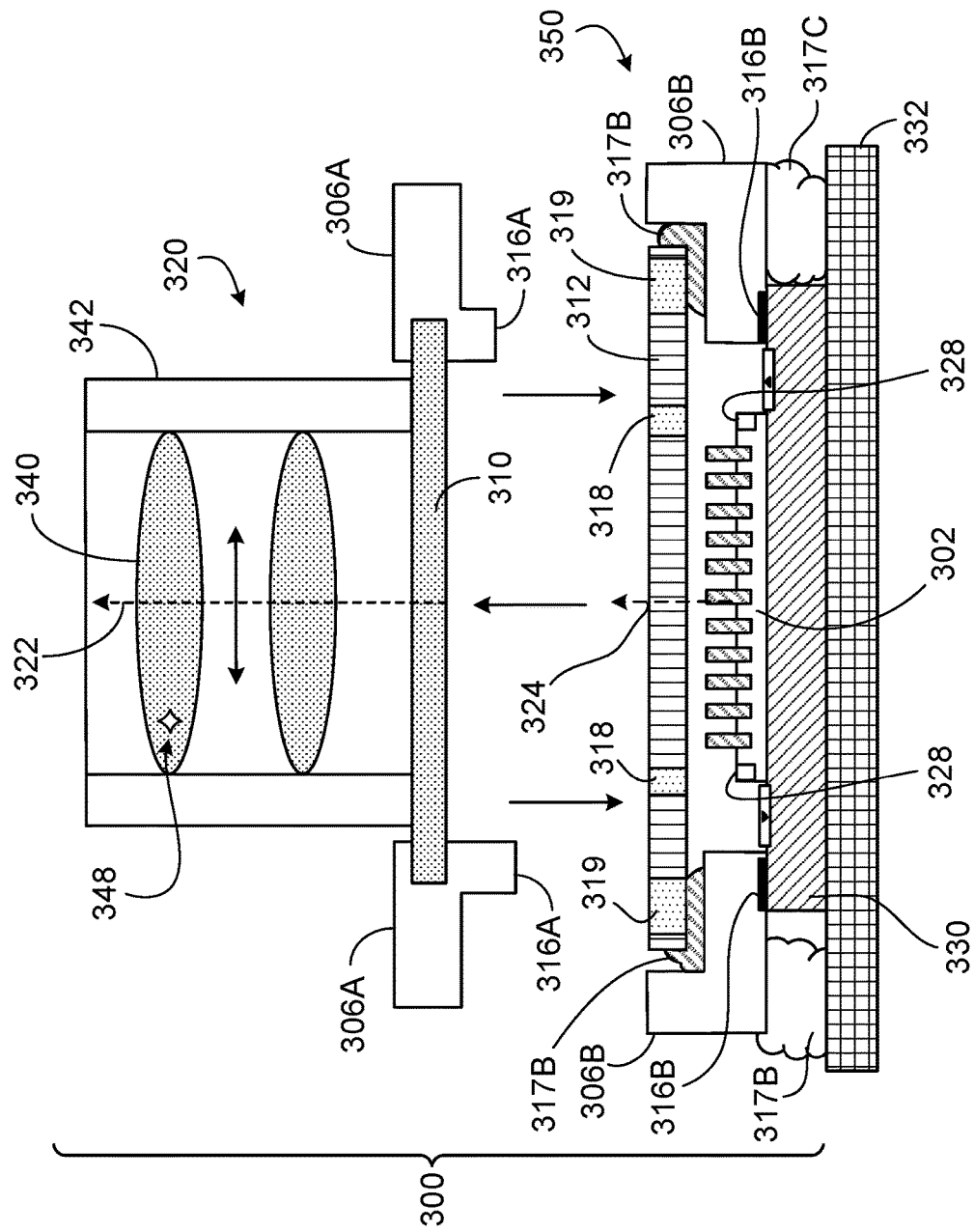
FIGS. 4A and 4B illustrate another example of an optoelectronic module that includes an optical system.
Figure 4B:
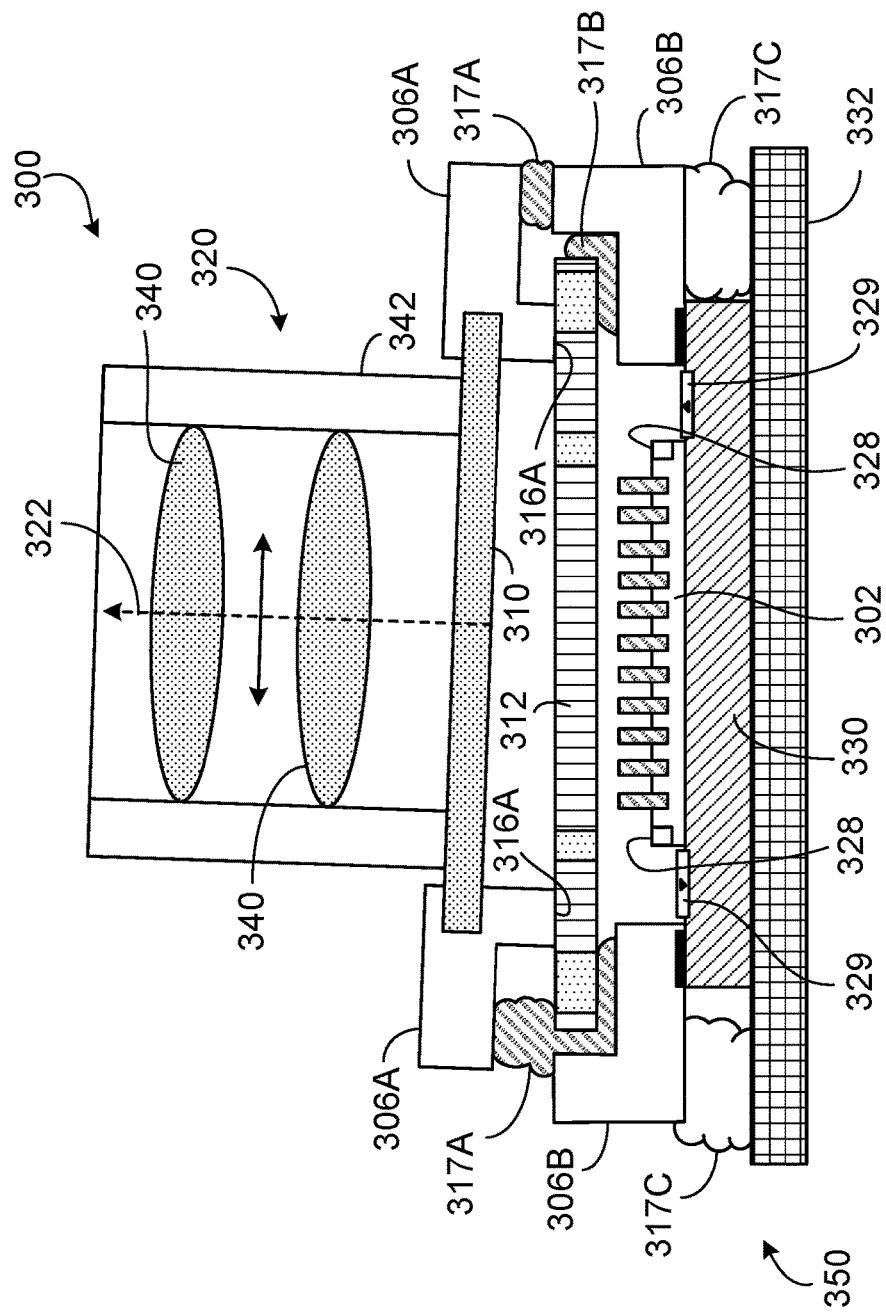

Techniques similar to those described above can be used to introduce tilt into other types of optoelectronic modules, such as modules that project light. For example, FIGS. 4A-4B illustrate an illumination projector 300 that includes a light emitting element 302, a mask 312 (e.g., a black chrome mask on a transparent substrate) through which light from the VCSEL 302 passes, and an optical sub-assembly 320. In the following description, a vertical cavity surface emitting laser (VCSEL) is used as an example of the active light emitting optoelectronic device 302. However, various other types of active light emitting devices can be used in some implementations (e.g., light emitting diodes (LEDs), infra-red (IR) LEDs, organic LEDs (OLEDs) or infra-red (IR) lasers). To generate a high-quality light projection/illumination, precise alignment preferably should be provided such that the focal length of the optical system (e.g., sub-assembly 320) should fall on the plane of the mask 312.

The VCSEL 302 can be mounted, for example, on a sub-mount sub-assembly, which can include, for example, a metal (e.g., copper) trace 330 on a sub-mount 332. To facilitate horizontal alignment of the VCSEL 302 on the metal trace 330, alignment features 329 can be provided on the VCSEL-side surface of the metal trace 330.

In the illustrated example, a spacer 306B laterally surrounds the VCSEL 302 and separates the mask 312 from the VCSEL/sub-mount sub-assembly. The surface 316B of the spacer 306B abuts (i.e., is in direct mechanical contact with) the VCSEL-side surface of the metal trace 330 and can serve as a vertical alignment feature. The spacer 306B also can be fixed to the sub-mount 332 by adhesive 317C. Advantageously, in the illustrated example, the adhesive 317C is not in close proximity to the VCSEL 302. Further, direct mechanical contact between the spacer 306B and the metal trace 330 can result in better height accuracy as there is no intervening layer of variable height/thickness.

The optical element that includes the mask 312 can be fixed to the spacer 306B by adhesive 317B, which can be cured, for example, by UV radiation. UV-transparent windows 319 can be provided in the mask 312 to permit the adhesive 317B to be cured using UV radiation.

The optical sub-assembly 320 can include one or more optical elements (e.g., lenses) 340 held by a barrel 342 over a transparent cover 310. In the illustrated example, a spacer 306A laterally surrounds the transparent cover 310. In other cases, the spacer 306A can be formed integrally as a single piece with the barrel 342. In such cases, the transparent cover 310 may be omitted.

The distance between the optical sub-assembly 320 and the mask 312 should be controlled carefully so that the focal length of the optical sub-assembly 320 coincides with the plane of the mask 312. Thus, in some cases, the height of the spacer 306A, which serves as a vertical alignment feature, can be customized, for example, by micromachining (e.g., cutting, dicing or grinding) the free end(s) 316A of the spacer 306A. The height of the first spacer 306A also can be adjusted, as needed, to introduce a desired amount of tilt between the optical axis 323 of the optical sub-assembly 320 and the plane of the mask 312. Such adjustment can be performed, for example, by micromachining (e.g., cutting, dicing or grinding) the free end(s) of the first spacer 306A. The tilt can help correct for distortion asymmetry. If the spacer 306A is formed as a single continuous annular or semi-annular protrusion, different parts of the spacer 306A can have different heights so as to provide the desired amount of tilt. If the spacer 306A is formed as multiple protrusions (e.g., pillars, such as columns or studs), the heights of the protrusions can differ from one another so as to provide the desired amount of tilt. The tilt can be introduced, for example, to reduce or prevent distortion asymmetry in a projected pattern or image in a far field plane.

Prior to attaching the optical sub-assembly 320 to the VCSEL sub-assembly 350, the position of the (central) optical axis 322 of the optical sub-assembly 320 can be determined. Also, the position of the (central) optical axis 324 of the VCSEL 302 can be determined using, for example, alignment windows 318 in the mask 312 and alignment marks 328 on the surface of the VCSEL 302. The transparent alignment windows 318 in the mask 312 allow the alignment marks 328 on the VCSEL 302 to be seen when the optical sub-assembly 320 is attached to the VCSEL sub-assembly 350. The optical sub-assembly 320 can thus be aligned precisely to the VCSEL 302. The optical sub-assembly 320 also can include one or more alignment marks 348, for example, on the lenses 340. The two sub-assemblies 320, 350 can be fixed to one another, for example, with an adhesive 317A such as epoxy (see FIG. 4B). In particular, the first and second spacers 306A, 306B can be fixed to another via the adhesive 317A. In contrast, the surface 316A of the spacer 306A can abut (i.e., be in direct mechanical contact with) the optical sub-assembly-side of the mask 312 so as to precisely fix the distance between the optical sub-assembly 320 and the mask 312.

Various modifications can be made to the foregoing implementations. Accordingly, other implementations are within the scope of the claims.

What is claimed is:

1. A method comprising:
acquiring optical data for an optical system that includes a vertical alignment feature;
machining the vertical alignment feature based, at least in part, on the acquired optical data so as to adjust an amount by which the vertical alignment feature extends from the optical system; and
placing the optical system over an optoelectronic sub-assembly such that the vertical alignment feature rests on a surface of the optoelectronic sub-assembly and such that an optical axis of the optical system is tilted with respect to a focal plane in the optoelectronic sub-assembly, wherein placing the optical system over the optoelectronic sub-assembly includes placing the optical system such that the machined vertical alignment feature rests directly in contact with a surface of an image sensor.

2. The method of claim 1 wherein machining the vertical alignment feature includes at least one of cutting, dicing or grinding.

3. The method of claim 1 wherein the acquired optical data includes modulation transfer function versus z data of an on-axis field parameter and a plurality of off-axis field parameters, wherein the z data represents a distance from the optical system.

4. The method of claim 1 wherein placing the optical system over the optoelectronic sub-assembly includes placing the optical system such that the vertical alignment feature rests directly in contact with a surface of an illumination projector sub-assembly.

5. The method of claim 4 wherein the illumination projector sub-assembly includes a mask, and wherein placing the optical system over the optoelectronic sub-assembly includes placing the optical system such that the vertical alignment feature rests directly in contact with a surface of the mask.

6. The method of claim 1 wherein the vertical alignment feature includes an annular or semi-annular protrusion, the method including machining different parts of the protrusion so as to have heights that differ from one another.

7. The method of claim 1 wherein the vertical alignment feature includes a plurality of protrusions, the method including machining the protrusions so as to have heights that differ from one another.

8. The method of claim 1 wherein the tilt at least partially corrects for distortion asymmetry.

* * * * *